US 6,791,096 B2

United States Patent
Komuro et al.

(10) Patent No.: US 6,791,096 B2
(45) Date of Patent: Sep. 14, 2004

(54) PROCESS CONDITIONS CHANGE MONITORING SYSTEMS THAT USE ELECTRON BEAMS, AND RELATED MONITORING METHODS

(75) Inventors: Osamu Komuro, Hitachinaka (JP); Hidetoshi Morokuma, Hitachinaka (JP); Chie Shishido, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/079,855

(22) Filed: Feb. 22, 2002

(65) Prior Publication Data

US 2003/0038250 A1 Feb. 27, 2003

(30) Foreign Application Priority Data

Aug. 20, 2001 (JP) ........................................ 2001-249569

(51) Int. Cl.[7] ............................................. G01N 23/225
(52) U.S. Cl. ..................... 250/492.2; 250/310; 250/311
(58) Field of Search ........................... 250/492.22, 310, 250/311, 309, 492.3

(56) References Cited

U.S. PATENT DOCUMENTS

| | | | | |
|---|---|---|---|---|
| 5,109,430 A | * | 4/1992 | Nishihara et al. | 382/151 |
| 5,655,110 A | * | 8/1997 | Krivokapic et al. | 716/19 |
| 5,790,254 A | * | 8/1998 | Ausschnitt | 356/603 |
| 5,856,053 A | * | 1/1999 | Watanabe | 430/22 |
| 5,969,273 A | * | 10/1999 | Archie et al. | 73/865.8 |
| 5,976,740 A | * | 11/1999 | Ausschnitt et al. | 430/30 |
| 6,107,637 A | * | 8/2000 | Watanabe et al. | 250/559.3 |
| 6,137,578 A | * | 10/2000 | Ausschnitt | 356/399 |
| 6,546,125 B1 | * | 4/2003 | Su | 382/144 |
| 2003/0010912 A1 | * | 1/2003 | Archie | 250/307 |

FOREIGN PATENT DOCUMENTS

| | | |
|---|---|---|
| JP | 11-288879 | 10/1999 |
| JP | 11-307431 | 11/1999 |
| JP | 2000-133569 | 5/2000 |

* cited by examiner

Primary Examiner—Nikita Wells
Assistant Examiner—Anthony Quash
(74) Attorney, Agent, or Firm—Dickstein Shapiro Morin & Oshinsky LLP

(57) ABSTRACT

In order to accurately monitor changes in exposure conditions (changes in exposure level and focus) at a product wafer level during lithography, changes in exposure conditions can be calculated by acquiring electron beam images of a first pattern portion and a second pattern portion different from one another in terms of the tendency of the changes in dimensional characteristic quantities against the changes in exposure conditions, then calculating the respective dimensional characteristic quantities of the first pattern portion and the second pattern portion, and applying these dimensional characteristic quantities to the models which logically link the exposure conditions and the dimensional characteristic quantities. Hereby, it is possible to supply the process conditions change monitoring systems and methods that enable output of accurate changes in exposure level and focus.

6 Claims, 17 Drawing Sheets

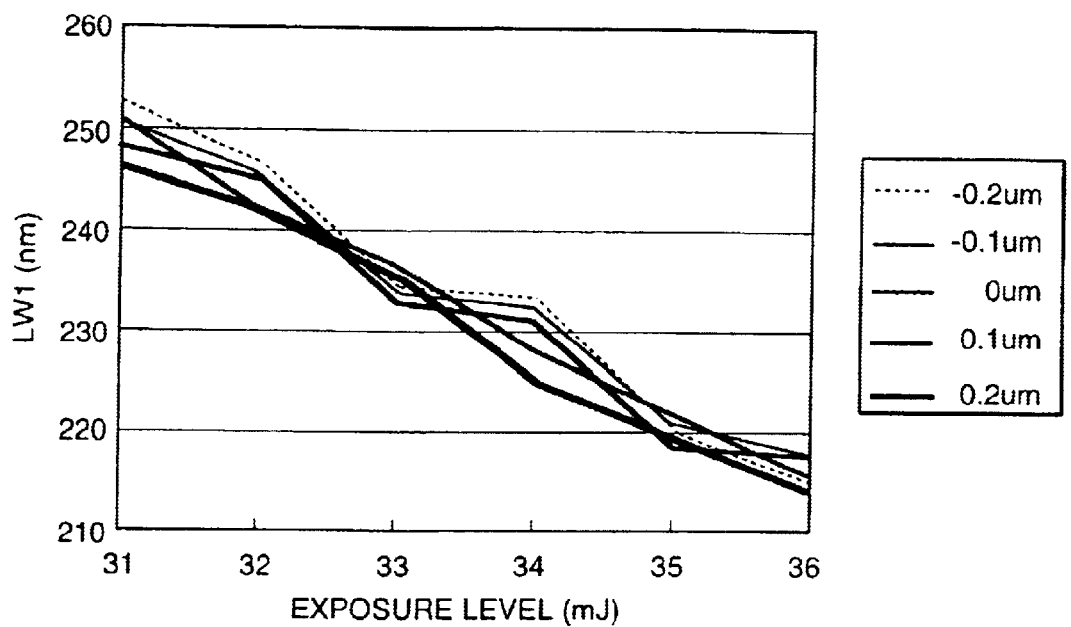

FIG. 13(a)
WHITE: TRANSMITTING PORTION
BLACK: SHIELDING PORTION
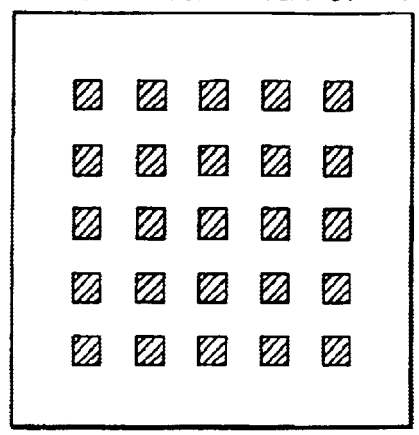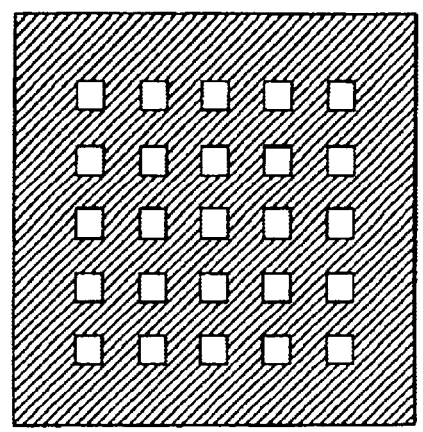
FIG. 13(b)
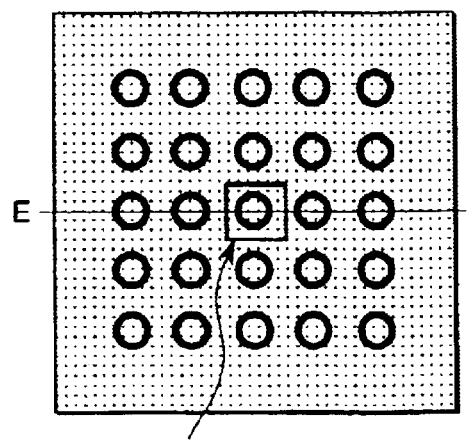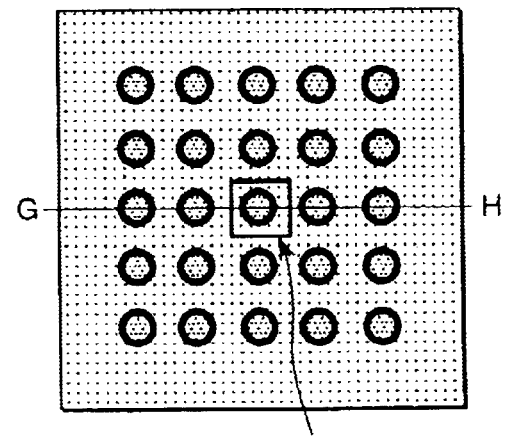
FIRST PATTERN PORTION　　　　SECOND PATTERN PORTION

WHITE: TRANSMITTING PORTION
BLACK: SHIELDING PORTION

W1 : WIDTH OF THE RESIST PATTERN BOTTOM
θ  : ANGLE OF INCLINATION OF THE RESIST PATTERN
W2 : WIDTH OF THE FILM PATTERN

PROCESS CONDITIONS CHANGE MONITORING SYSTEMS THAT USE ELECTRON BEAMS, AND RELATED MONITORING METHODS

BACKGROUND OF THE INVENTION

The present invention relates to the systems and methods in which, during lithography, whether pattern exposure to the resist film on a wafer has been provided under the appropriate exposure conditions by use of electron beam images of the resist patterns. The invention relates particularly to the technology for controlling such an exposure process and maintaining the appropriate exposure conditions.

The flow of conventional lithography is described below.

The formation of a resist pattern is accomplished by coating a semiconductor wafer or a similar substrate with a resist (photosensitive material) to the required thickness, then exposing a mask pattern to light using an exposure unit, and conducting a developing process. The resist pattern that has thus been formed is dimensionally checked using a scanning-type electronic microscope provided with a length measuring function (this microscope is called "length-measuring SEM or CD-SEM"). An example of processing with conventional length-measuring SEM is described below. First after an electron beam image of the area which includes the section requiring stringent dimensional accuracy has been acquired in process 1, dimensions are measured in process 2, then whether the dimensions satisfy reference values is judged in process 3, and if the reference values are not satisfied, the exposure level of the exposure unit is corrected in process 4 (the amount of correction of the exposure level is represented as ΔE). For example, in the case of a positive type of resist, if the resist size is too large, the exposure level is increased, and if the resist width is too small, the exposure level is reduced. It is not rare that the amount of correction of the exposure level is determined in accordance with the experience and working knowledge of the operator.

FIG. 17 represents the relationship between a resist pattern and an after-etching film pattern (data source: "Handbook of Electronic Beam Testing", p. 255, a research document cited at the 98th Study Session of the 132nd Committee on the Application of Charged Beams to Industries, held under the auspices of the Japan Society for the Promotion of Science). Given the same etching conditions, there is a relationship of invariableness between the shape of the resist pattern and that of the film pattern. To obtain a film pattern of the required shape, therefore, the resist pattern also needs to have the required shape. For example, during the comment of new processes, "conditions establishing operations" for identifying the focus and exposure level at which the required resist pattern shape can be obtained are performed by, after creating a wafer on which a pattern has been printed by changing the focus and the exposure level with each shot (unit of exposure) [an example of a wafer is shown in FIG. 18; such a wafer is usually called the focus exposure matrix (FEM)], measuring the dimensions of the resist pattern for each shot, then cutting the wafer, and examining its cross-sectional shape. A system for supporting the conditions establishing operations is set forth in Japanese Application Patent Laid-Open Publication No.Hei 11-288879. These operations are performed to determine the exposure level (E0) and focus value (F0) at which greater margins can be obtained, and the product wafer undergoes exposure based on the corresponding conditions. However, changes in the photosensitivity of the resist, changes in the thickness of the reflection preventive film under the resist, drifts in the various sensors of the exposure unit, and various other changes in process conditions, may prevent the required resist pattern shape from being obtained under the E0 and F0 conditions that have been determined during the conditions establishingoperations. Dimensionalmeasurement (process 2) described above takes place to detect these changes in process conditions, and the prior art described above is intended to compensate for changes in resist shape, caused by changes in process conditions, through correcting the exposure level.

SUMMARY OF THE INVENTION

Under the prior art, the line width and other dimension values are examined using length-measuring SEM to detect changes in process conditions and undertake corrective measures, and if the dimension values do not satisfy reference values, the exposure level is corrected. The prior art, however, poses the following three problems:

The first problem is that changes in process conditions, not associated with any changes in the dimension values, more specifically, changes in the focus value during exposure cannot be detected. The resist has an approximately trapezoidal cross-sectional shape. Since inclined portions are greater than flat portions in terms of secondary electron signal intensity, the signal waveform peaks at the portion corresponding to the edge of the trapezoid as shown in FIG. 19(a). An example of dimensional measurement with length-measuring SEM is described below. As shown in FIG. 19(b), a straight line is drawn along both the outer portion and base portion of the peak, then the crossing point of the two lines is derived, and after the same has also been performed on the other side, the distance between the two crossing points is taken as the line width. FIG. 20 is a graph on which the line width was plotted for each exposure level (from "e0" to "e8") with the focus value plotted along the horizontal axis in order to represent how the line width would change when the exposure level and the focus value changed. The magnitude of the exposure level increases in the order from "e0" to "e8", and there is the relationship that the line width decreases with increases in the exposure level (this relationship applies to a positive resist, and the opposite relationship is established for a negative resist). Changes in the exposure level can therefore be detected by examining the line width. However, as is obvious from the graph, changes in the line width are not too significant with respect to those of the focus value, and near the appropriate exposure level of "e4", in particular, even if the focus value changes, the line width suffers almost no changes. Changes in the focus value, therefore, cannot be detected by examining the line width. On the other hand, even if the line width does not change, when the focus value changes, the cross-sectional shape of the resist will change as shown in FIG. 20(b). Since, as described earlier in this document, changes in the cross-sectional shape also affects the shape of the film pattern existing after etching, the use of the prior art which does not enable changes in the focus value to be detected is likely to create large quantities of defects in the shape of the film pattern existing after etching.

The second problem is that deviations in focus value cannot, of course, be accommodated by merely correcting the exposure level only. For example, for situation A shown in FIG. 20(a), since the line width is greater than its normal value, the exposure level will be increased according to line width measurement results. However, since the deviation in focus value must be corrected, situation B shown in FIG. 20(b) will only result and the cross-sectional shape of the resist will not return to normal. Consequently, defects in the shape of the film pattern existing after etching are likely to be created in great quantities in this case as well.

The third problem is that such quantitative information on process conditions changes that is required for the maintenance of a normal exposure process cannot be obtained with the above-described prior art. The tolerances for the exposure level and focus value are being narrowed very significantly with the decreases in pattern rule in recent years. For example, for a semiconductor pattern whose design rule is 180 nm, the rate of change of pattern size is required to be controlled below 10%, and to implement this, it is necessary to acquire information that quantitatively represents changes in process conditions, that is to say, to obtain accurate data on what degree of deviation in the exposure level in terms of milli-joules and on what degree of deviation in the focus value in terms of microns. In the case of the above-described prior art, no deviations in the focus value can be detected, and it cannot be said that deviations in the exposure level are detected accurately, either. The reason is that in general, the line width changes with the focus value as well. The maintenance of a normal exposure process, therefore, cannot be anticipated with the above-described prior art.

The object of the present invention is to supply the means that enables the detection of changes in focus value, particularly to supply the process conditions change monitoring systems and methods that enable the detection not only of changes in exposure level, but also of changes in focus value, and output of accurate changes in both exposure level and focus value.

In order to fulfill the object described above, the present invention enables the below-described process conditions change monitoring system and method to be constructed on length-measuring SEM.

In the present invention, a means of calculating the dimensional characteristic quantities of resist patterns, including the edge widths and pattern widths thereof, from the electron beam images that have been acquired using length-measuring SEM, and a means of saving the models for establishing logical linking between exposure conditions and dimensional characteristic quantities are provided and changes in the exposure conditions can be calculated by acquiring respective electron beam images of a first pattern portion and a second pattern portion different from one another in the tendency of the changes in dimensional characteristic quantities against changes in the exposure conditions, then calculating the respective dimensional characteristic quantities of the first pattern portion and the second pattern portion, and applying these dimensional characteristic quantities to the models which establish logical linking between exposure conditions and dimensional characteristic quantities.

Also, in the present invention, the first pattern portion has a pattern constructed so that the deviation of the focus value in its plus direction increases the corresponding edge width, and the second pattern portion has a pattern constructed so that the deviation of the focus value in its minus direction increases the corresponding edge width.

In addition, in the present invention, the above-described first pattern portion uses a masked pattern and the above-described second pattern portion uses a non-masked pattern.

Furthermore, in the present invention, different places in one image are used as the first pattern portion and the second pattern portion so that throughput does not decrease.

Furthermore, in the present invention, the relationship between changes in the edge width(s) and focus value(s) of the first and/or second pattern, and the relationship between changes in the pattern width(s) and exposure level(s) of the first and/or second pattern, are stored into memory as relational expressions, and these relational expressions are used as the models for establishing logical linking between exposure conditions and dimensional characteristic quantities.

Furthermore, the present invention supplies a function that automatically calculates process window data from the relationship between deviations in edge width and focus and from the relationship between pattern width and exposure energy level.

BRIEF DESCRIPTION OF THE DRAWINGS

FIG. 8 is an explanatory diagram of the model representing the relationship between edge width and focus.

FIG. 11 is a diagram showing another embodiment of a model which logically links exposure conditions and dimensional characteristic quantities.

FIGS. 13(a) and 13(b) are diagrams showing a second example of patterns suitable for process conditions change monitoring.

DETAILED DESCRIPTION OF THE PREFERRED EMBODIMENT

The first preferred mode of embodiment of the present invention is described below using drawings.

(1) Total Flow of the First Preferred Mode of Embodiment

Figure 1:
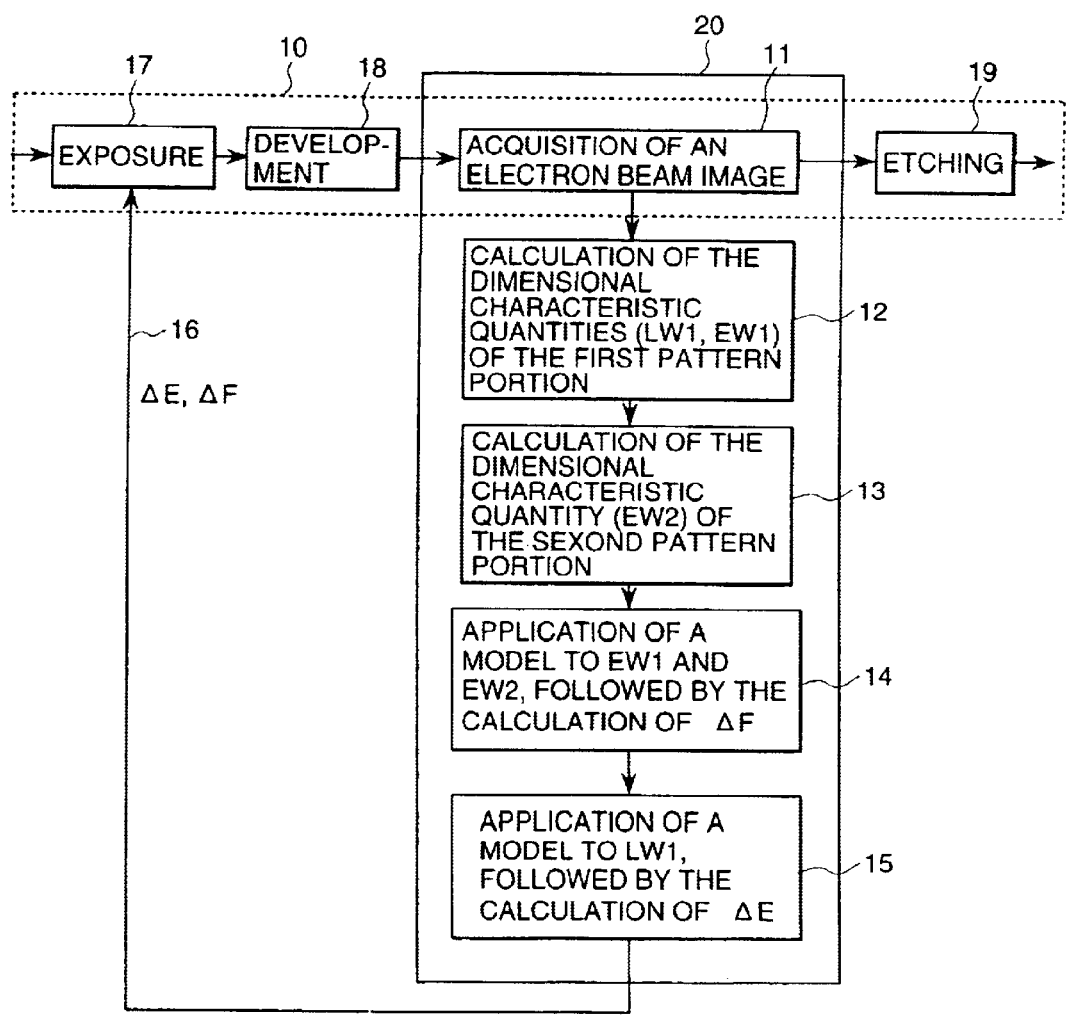
FIG. 1 is process diagram of the lithography which uses the process conditions change monitoring system pertaining to the first preferred mode of embodiment.

FIG. 1 relates to a first embodiment of the present invention and is a conceptual diagram of lithographic processes provided with a process conditions change monitoring system which has been constructed on CD-SEM. Portion 10 enclosed by a broken line in the figure denotes the flow of a product wafer in a semiconductor substrate manufacturing system, and the arrow indicates that processing advances in order from the left to the right. Also, portion 20 enclosed by a solid line denotes the flow of processing by the process conditions change monitoring system constructed on CD-SEM, and the arrow indicates that processing advances in order from top to bottom.

Changes in process conditions can be monitored in the conventional timing of dimensional checking. After an electron beam image of the area including the first pattern portion and second pattern portion described later in this document has been acquired in process 11, line width LW1 and edge width EW1 are calculated as the dimensional characteristic quantities of the first pattern portion in process 12, and edge width EW2 is calculated as the dimensional characteristic quantity of the second pattern portion in process 13. After this, the calculation of focal deviation value ΔF is accomplished in process 14 by applying, to EW1 and EW2, the model for establishing logical linking between edge width and focal deviations, and the calculation of exposure level error ΔE is accomplished in process 15 by applying, to LW1, the model for establishing logical linking between pattern width and exposure level. And in process 16, the results are fed back into the exposure conditions for exposure 17. Development 18 plates place under newly established exposure conditions, and after electron beam image re-acquisition 11, etching 19 and other processes are performed under newly established exposure conditions. Hereby, a new semiconductor substrate manufacturing system is supplied. In the present invention, if any deviations from the optimal focus or exposure level values are detected (even within the process window data range), since the deviations will be detected and fed back into the exposure conditions, the normal status of the exposure process can be maintained. One of the greatest features of the present invention exists in that slight deviations in focus and in exposure level can be calculated accurately. Further details of the first embodiment of the invention are described below.

(2) Configuration of the CD-SEM

Figure 2:
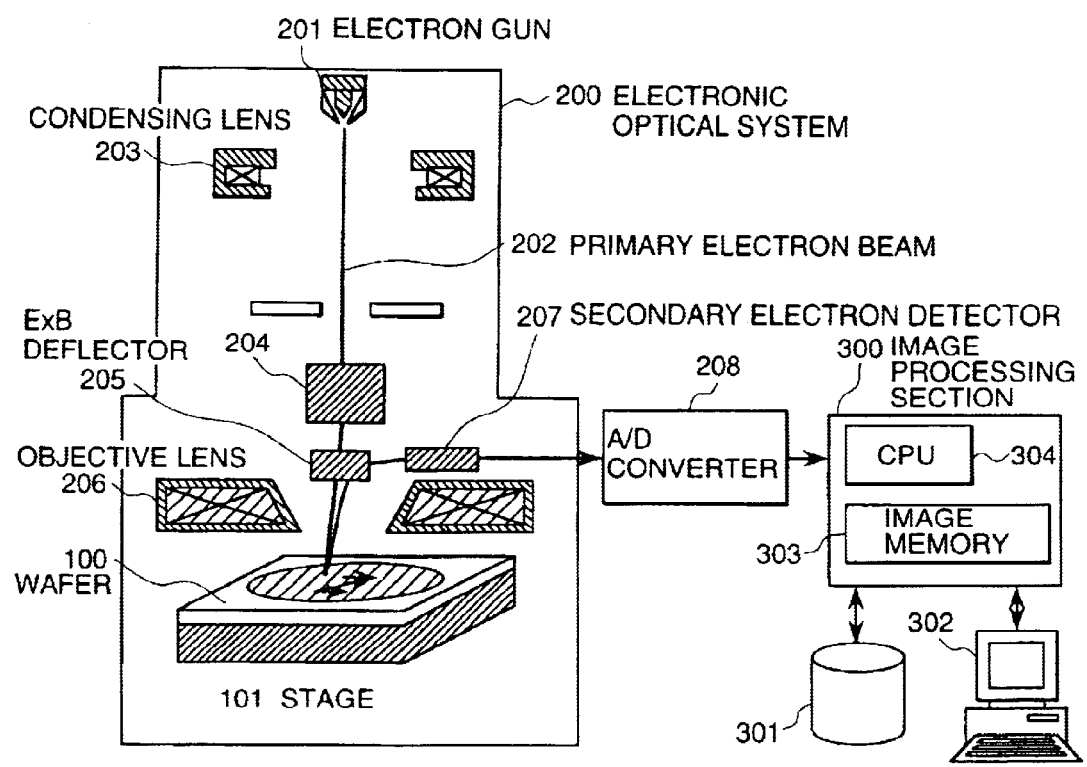
FIG. 2 is a total block diagram of the CD-SEM pertaining to the first preferred mode of embodiment.

First, the CD-SEM used for the process conditions change monitoring system pertaining to the present invention is described below. FIG. 2 is a block diagram showing the configuration of the CD-SEM. This figure shows an electron optical system 200. In FIG. 2, a primary electron beam 202 from an electron gun 201 is emitted so as to pass through a beam deflector 204, an ExB deflector 205, and an objective lens 206, and condense on a wafer 100 (including a liquid-crystal substrate) placed on a stage 101. After the electron beam has been emitted, a secondary electron is emitted from wafer 100, a sample. The secondary electron that has been emitted from wafer 100 is deflected by ExB deflector 205 and detected by a secondary electron detector 207. A two-dimensional electron beam image is obtained by detecting the electron stemming from the sample in synchronization with either the two-dimensional scanning of the electron beam by deflector 204 or the X-axial repetitious scanning of the electron beam by deflector 204, and with the Y-axial continuous movement of the wafer by stage 101. The signal that has been detected by secondary electron detector 207 is converted into a digital signal by an A/D converter 208, from which the signal is then sent to an image processing section 300. Image processing section 300 has an image memory medium 303 for temporary storage of digital images, and a CPU 304 for calculating dimensional characteristic quantities from the images within the image memory. The image processing section also has a memory medium 301 which contains the models for establishing logical linking between the exposure conditions and dimensional characteristic quantities that have been examined beforehand. A display unit 302 is connected to image processing section 300 so that the necessary equipment operations, detection results confirmation, and others can be implemented via a graphical user interface (hereinafter referred to as the GUI).

(3) Method of Model Construction

Figure 3:
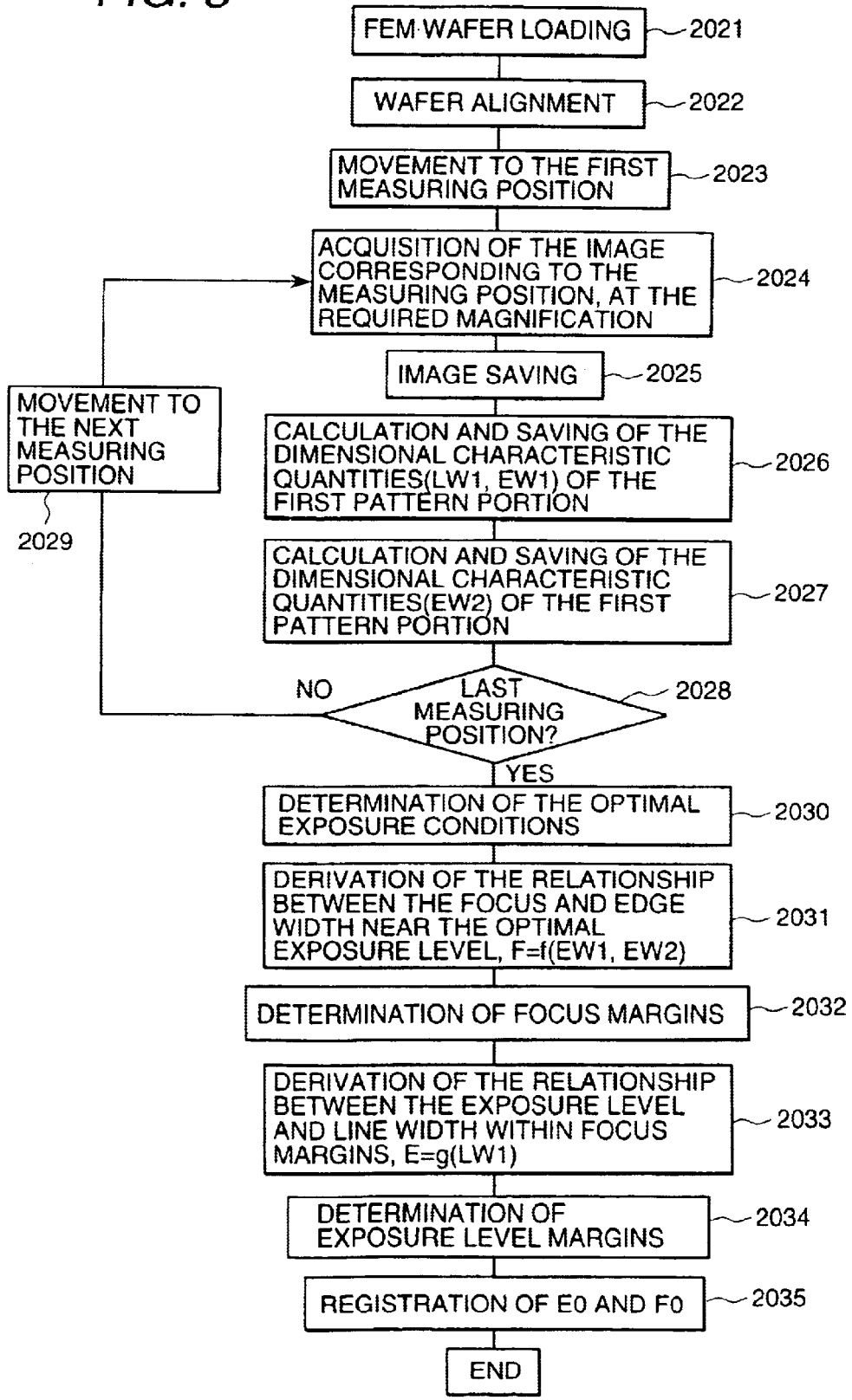
FIG. 3 is a diagram showing the creation sequence for a model which logically links exposure conditions and dimensional characteristic quantities.

Next, the method of constructing the models to be used in processes 14 and 15 of FIG. 1 is described below. The flow of model construction is shown in FIG. 3. In this embodiment, prior to product wafer loading, the models are constructed using an FEM wafer.

After FEM wafer loading as process 2021, the wafer is aligned as process 2022 and control is moved to the first measuring position as process 2023.

Figure 4A:
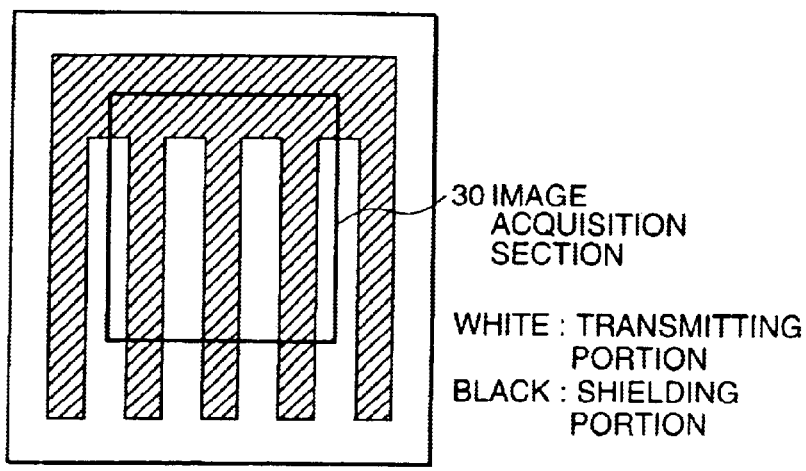
FIGS. 4(a) through 4(c) are diagrams showing an example of patterns suitable for process conditions change monitoring.
Figure 4B:
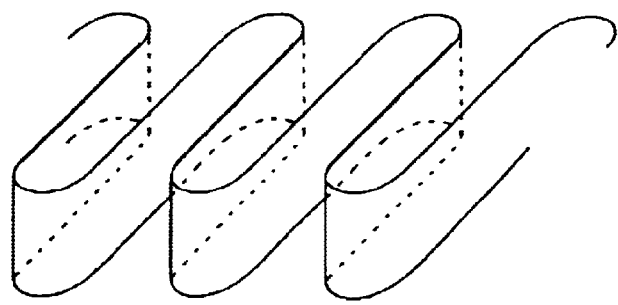
Figure 4C:
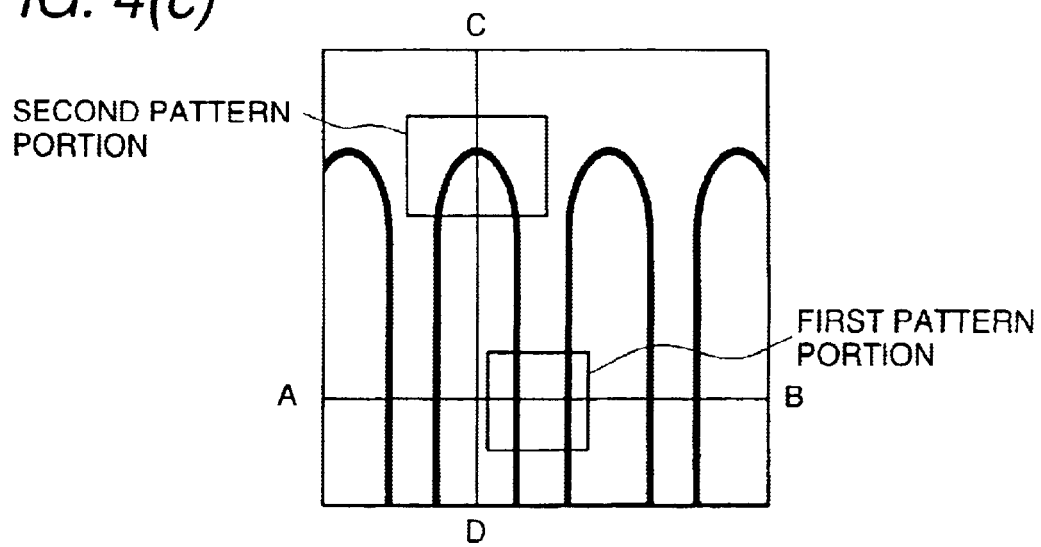
Figure 5A:
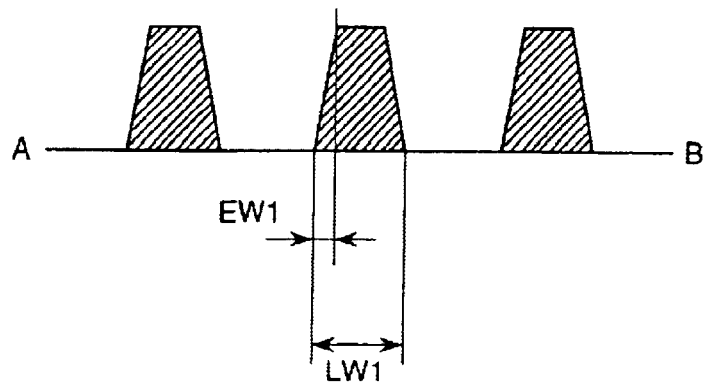
FIGS. 5(a) through 5(c) are cross-sectional views showing an example of patterns suitable for process conditions change monitoring.
Figure 5B:
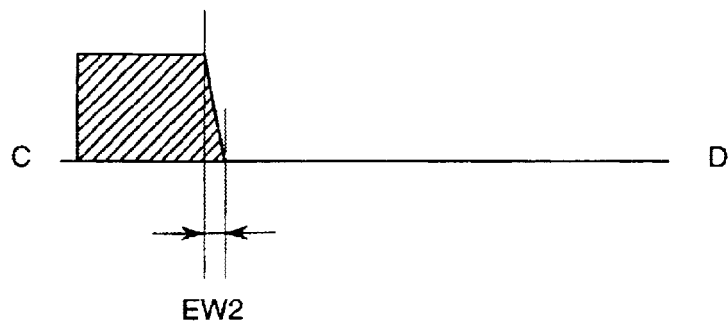

In process 2024, an electron beam image of the area including a first pattern portion and a second pattern portion is acquired. A masked pattern with critical dimensions (the most stringent dimensions required with respect to accuracy), and a non-masked pattern with critical dimensions are suitable as the first pattern portion and the second pattern portion, respectively. An example of patterns is shown in FIG. 4. In this example, both a second pattern portion (a linear masked pattern) and a first pattern portion (the leading end of a linear non-masked pattern) are included. FIG. 4(a) shows an image processing section 30 in a binary mask pattern image format, wherein white and black denote a transmitting portion and a shielding portion, respectively, and a positive-type resist is assumed. FIG. 4(b) shows the image of an after-development pattern. When an electron beam image of the section corresponding to the portion enclosed in a box in FIG. 4(a) is acquired, an image that represents bright edge portions and dark flat portions as shown in FIG. 4(c), will be obtained. The cross-sectional shapes of sections A-B and C-D are shown in FIGS. 5(a) and 5(b), respectively. As shown in FIG. 5(a), for the film pattern having the A-B cross section, the line width LW1 and edge width EW1 of the first pattern portion are detected, and as shown in FIG. 5(b), for the film pattern having the C-D cross section, edge width EW2 of the second pattern portion is detected. The top edge of the first pattern portion assumes roundness with a plus focus value, and edge width EW1 is extended. At this time, the edge portion of the second pattern is almost the same as formed with the best focus value. Also, for a minus focus value, the opposite is detected and although the edge portion of the first pattern is almost the same as formed with the best focus value, the bottom edge of the second pattern portion assumes roundness and edge width EW2 is extended. As can be seen hereby, the way the pattern suffers changes with changes in focus value differs between the first pattern and the second pattern. Attaching attention to both the first pattern and the second pattern enables one to estimate to what extent and in which direction the focus value deviates from the best focus value. Changes in process conditions can be estimated more accurately by inserting the monitoring-dedicated pattern including the first and second patterns into the wafer.

Figure 5C:
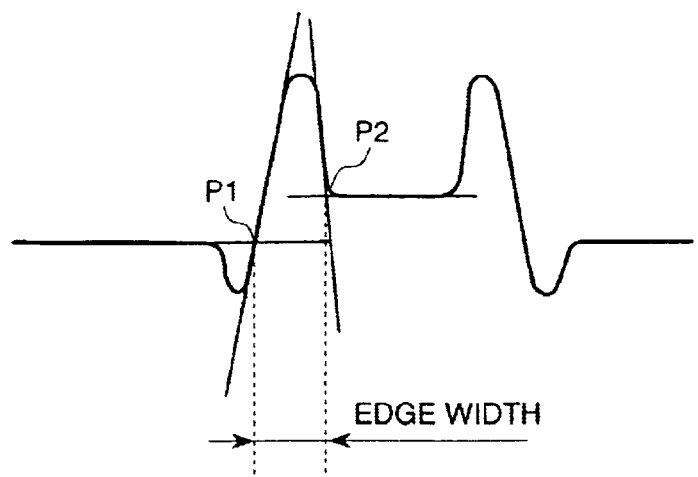
Figure 19A:
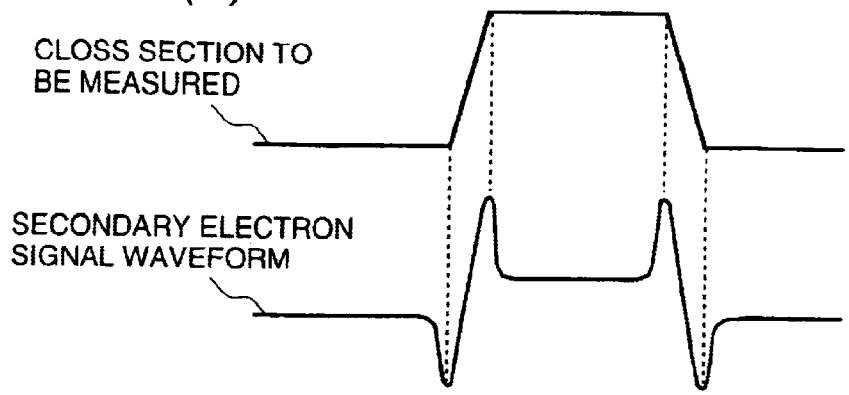
FIGS. 19(a) and 19(b) are epitomic diagrams representing the relationship between the cross-sectional shape of a resist pattern and the level of a secondary electron signal.
Figure 19B:
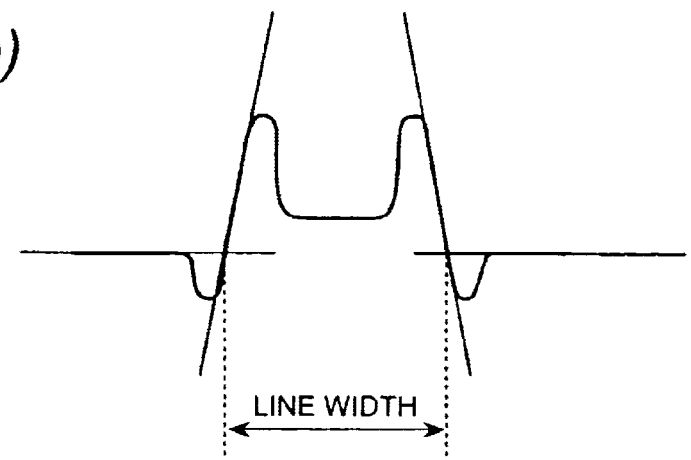

After acquired images have been saved as process 2025, the line width LW1 and edge width EW1 of the first pattern portion are calculated and saved as process 2026. Following this process, process 27 takes place to calculate and save edge width EW2 of the second pattern portion. The line width can be calculated in such manner as shown in FIG. 19(*b*), whereas the edge width can be calculated by measuring, as shown in FIG. 5(*c*), the clearance between crossing point P1 of the lines drawn along the outer portion and base portion of the peak, and crossing point P2 of the lines drawn along the inner portion and base portion of the peak. Whether the particular position is the last measuring position is judged as process 2028, and if not so, control is moved to the next measuring position as process 2029; if the position is the last measuring position, control is moved to process 2030.

Figure 20A:
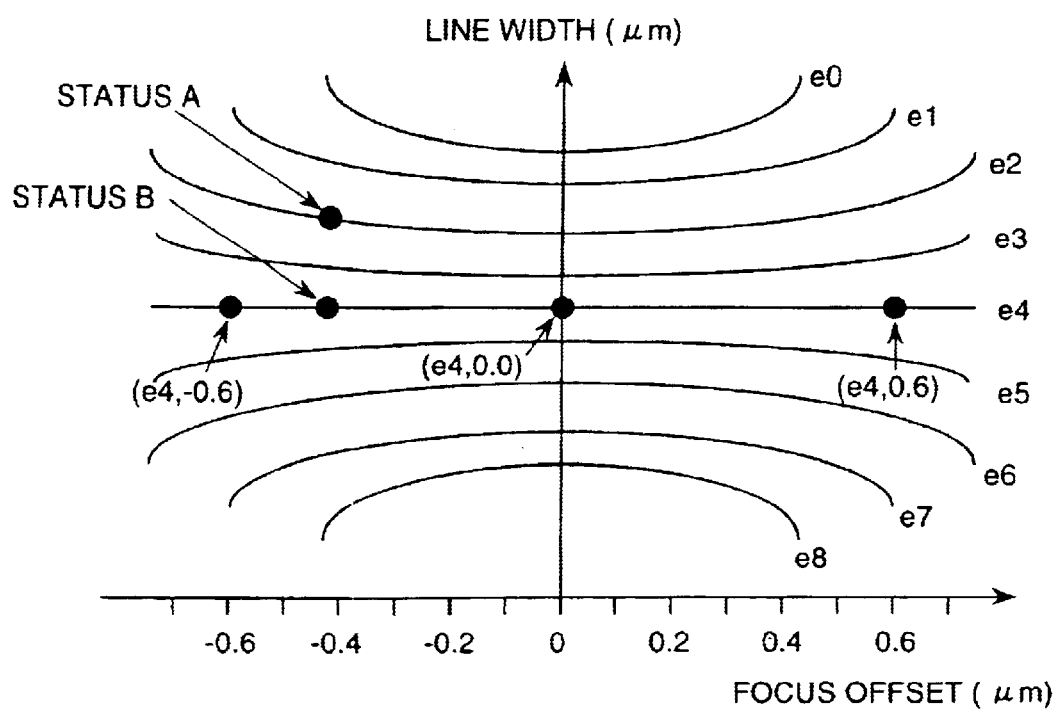
FIGS. 20(a) and 20(b) are graphs showing the relationship between exposure level, focus, and line width.
Figure 20B:
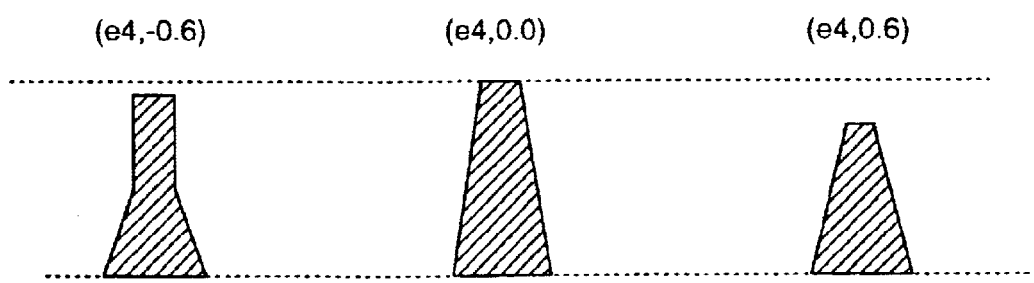

In process 2030, after processes 2024 to 2027 have been performed on all measuring positions on FEM, the optimal exposure level is determined from measurement results relating to line widths LW1 of all positions. In this phase, such a graph as shown in FIG. 20(*a*) is displayed in the GUI window and the exposure level at which the required line width has been obtained is determined automatically or at the discretion of the operator. In FEM, area 1001 of FIG. 9(*a*) is determined.

Figure 6A:
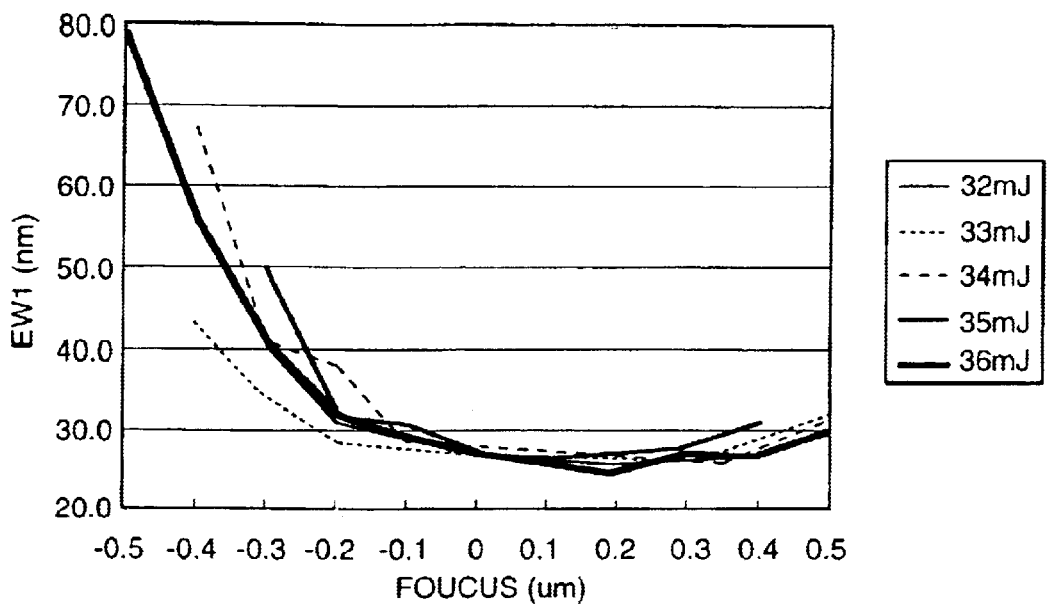
FIGS. 6(a) and 6(b) are graphs showing changes in edge width against focus.
Figure 6B:
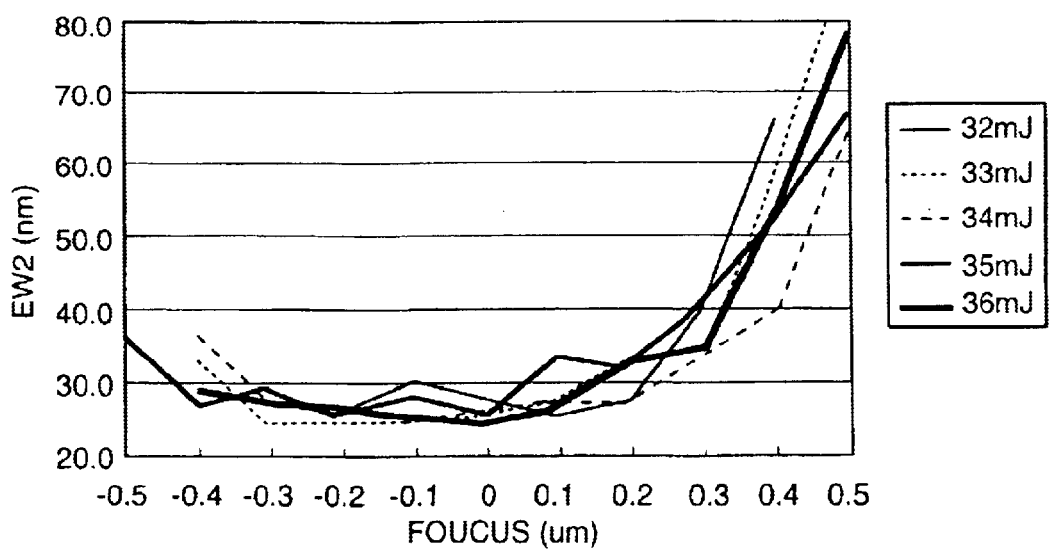
Figure 7A:
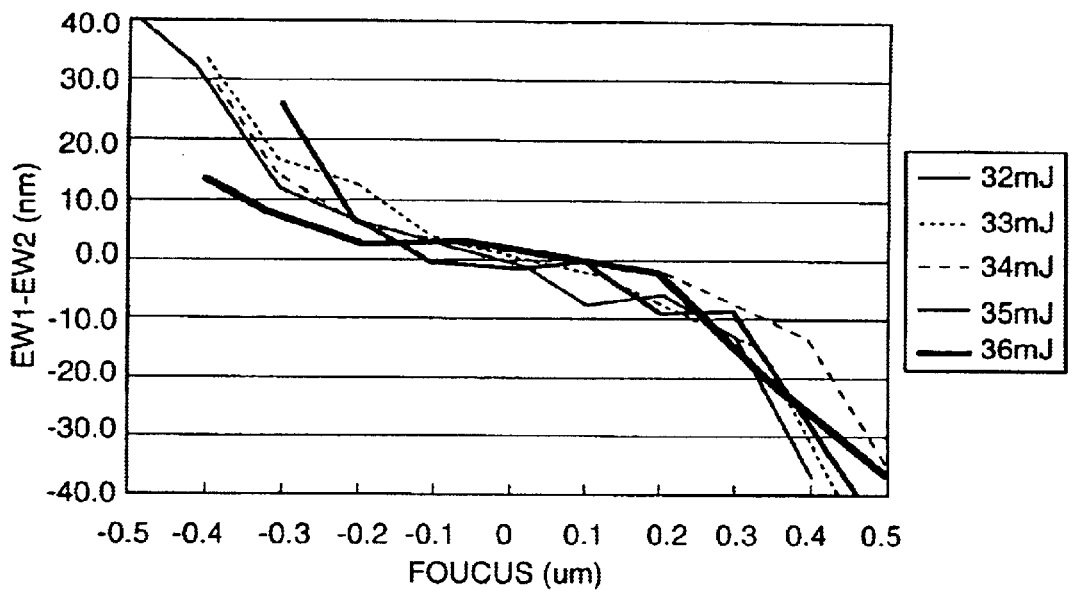
FIGS. 7(a) and 7(b) are other graphs showing changes in edge width against focus.
Figure 7B:
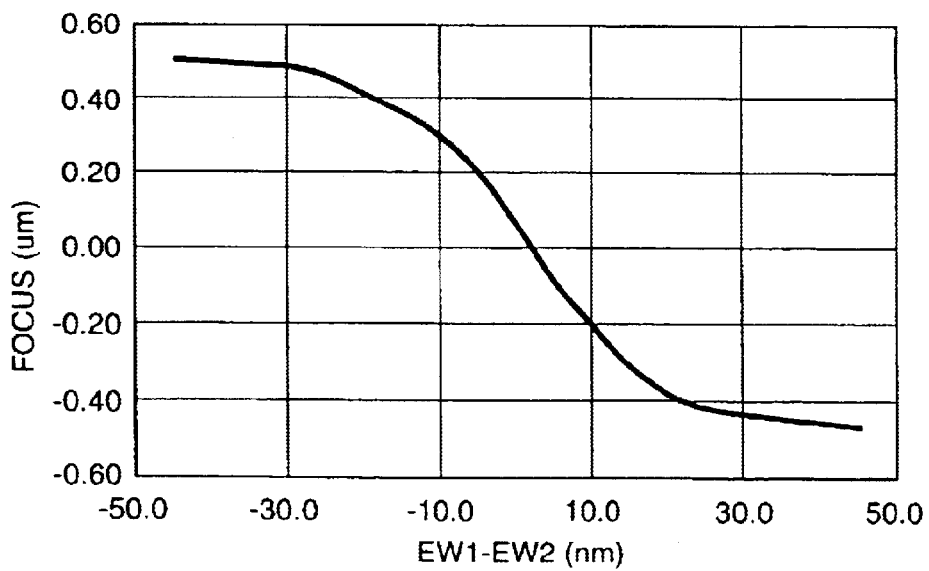
Figure 9A:
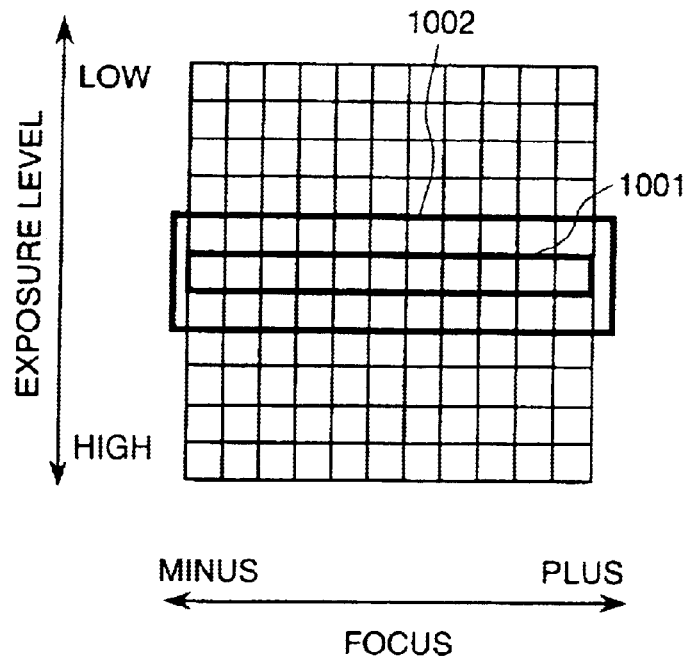
FIGS. 9(a) and 9(b) are diagrams showing the acquisition of the creation sequences for the models which establish logical linking between exposure conditions and dimensional characteristic quantities.
Figure 9B:
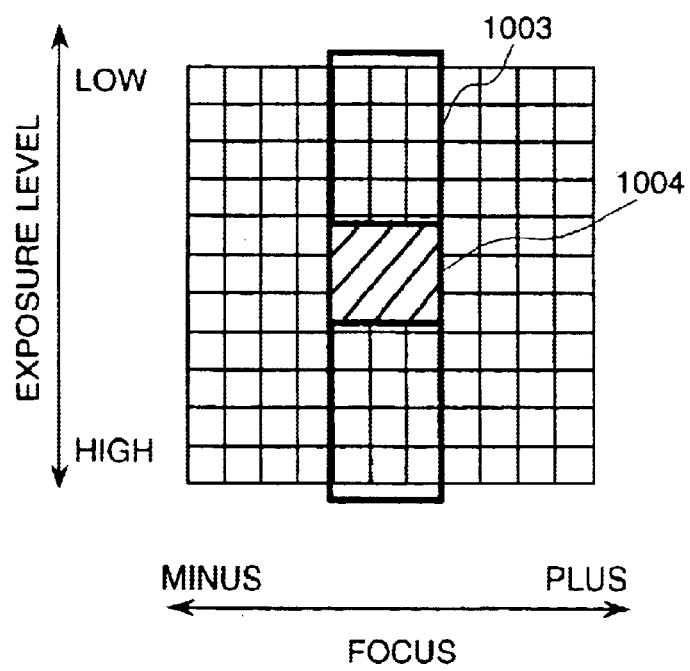

In process 2031, the relationship between focus and edge width is derived from the edge widths EW1 and EW2 measured in the vicinity of the optimal exposure level (in FEM, area 1002 of FIG. 9(*a*)) that has have been determined as described above. The vicinity of the optimal exposure level means, for example, the range of the optimal exposure level ±2 mJ. As described earlier, EW1 is the edge width of the linear masked pattern, and EW2 is the edge width at the leading end of the linear non-masked pattern. The inventors' test results on the relationship between these edge widths and focus are shown in FIG. 6. FIG. 6(*a*) shows test results on EW1, and FIG. 6(*b*) shows test results on EW2. In both cases, the edge widths in the focus range from −0.5 to +0.5 microns for exposure levels of 32 mJ, 33 mJ, 34 mJ, 35 mJ, and 36 mJ (optimal exposure level: 34 mJ) are plotted along the vertical axis, and the focus values are plotted along the horizontal axis. As shown in the figure, a significant difference exists between EW1 test results and EW2 test results. That is to say, the former significantly changes in the minus direction and does not significantly change in the plus direction, whereas the latter significantly changes in the plus direction and does not significantly change in the minus direction. In process 2031 of FIG. 5, a model for calculating the focus value from two edge width values is created by use of the difference in behavior between EW1 and EW2. In other words, this process is performed to supply a model saving means (unit). An example of such a model is shown in FIG. 7. In this figure, the numeral 1 is assigned to the expression of EW1−EW2 (FIG. 7(*a*)) at 32 mJ, 33 mJ, 34 mJ, 35 mJ, and 36 mJ, and the results are taken as a model.

[Numerical Expression 1]

$$f = c\frac{e^{a(x-b)} - e^{-a(x-b)}}{e^{a(x-b)} + e^{-a(x-b)}} + d \qquad \text{Numerical expression 1}$$

where x=EW1−EW2.

The numeral 1 is for calculating focus value "f" from "x =EW1−EW2", and parameters "a", "b", "c", and "d" in the expression are determined by assigning the numeral 1 to FIG. 7(*a*) and using a method such as the least squares method. Although the parameters are calculated automatically, such graphs as shown in FIGS. 7(*a*) and 7(*b*) are displayed in the GUI window and the operator can confirm whether the model is appropriate. If the model is judged to be inappropriate, the operator can modify the model by, for example, deforming the curve of FIG. 7(*a*) using a tool such as a pointing device. After the model has been modified, a relational expression in which the parameters have been modified to "a'", "b'", "c'", and "d'", is establishes or the model itself is saved as a look-up table.

In process 2032, the focus value range where the rate of change of the edge width with respect to focus is maintained at or below a fixed value (for example, within ±2.0 microns) is determined and this range is defined as focus margins (focal deviation tolerances). More specifically, an absolute value is obtained by differentiating the numeral 1 by "x", and the range in which the absolute value is maintained at or below a separately determined threshold value is taken as focus margins. These margins are equivalent to the focal depths of the exposure unit in the corresponding pattern dimensions. FIG. 9 is a diagram showing the acquisition of the creation sequences for the models which establish logical linking between exposure conditions and dimensional characteristic quantities. FIG. 9(*a*) is a diagram showing the relationship between exposure level and focus value, and FIG. 9(*b*) is a diagram showing the tolerance for the focus value. In FEM, area 1003 in FIG. 9(*b*) corresponds to the focus margins.

In process 2033, the relationship between exposure level and line width is derived from the measurement results relating to line width LW1 within the focus margins which have been determined as described above. The inventors' test results on the relationship between line width LW1 and exposure level are shown in FIG. 8. FIG. 8 shows the results that were obtained when the line widths at various exposure levels were plotted with each exposure level taken along the horizontal axis in the focus range from −0.2 to +0.2 microns (focus margins from −0.2 to +0.2 microns). As shown in the figure, there is the relationship that line width linearly decreases with increases in exposure level. In this figure, the numeral 2 is assigned to the line widths in the range from −2 to +0.2 microns, and the results are taken as a model.

[Numerical Expression 2]

$$e = -hx + g \qquad \text{Numerical expression 2}$$

where x=LW1.

The numeral 2 is for calculating exposure level "e" from "x=LW1", and parameters "h" and "g" in the expression are determined by assigning the numeral 2 to FIG. 8 and using a method such as the least squares method. The method of operator intervention via the GUI window is the same as for process 2032.

In process 2034, the exposure level range in which the line width stays within its fixed value ±α is derived from the numeral 2 and this exposure level range is determined as exposure level margins (exposure level error tolerance). α is a separately determined threshold value, which is usually set to about 10% of the line width. In FEM, area 1004 (shaded portion) in FIG. 9(b) corresponds to the threshold value, and in process 2035, the center of this area is registered as the optimal exposure level E0 and the optimal focus value F0.

(4) Monitoring of Changes in Process Conditions

Next, attention is returned to FIG. 1 and the method of monitoring changes in process conditions is described below.

First, the optimal exposure level E0 and the optimal focus value F0 are set as the exposure conditions for the commencement of product wafer processing. After this, process conditions change monitoring shown in FIG. 1 occurs in synchronization with the dimensional measurement of the product wafer. Processing up to acquiring an electron beam image of the area including the first and second pattern portions, and calculating LW1 and EW1 as the dimensional characteristic quantities of the first pattern portion and EW2 as the dimensional characteristic quantity of the second pattern portion, namely, processing up to processes 2001–2003 is the same as for the construction of the model described earlier in this document.

In process 2004, focus value F is calculated by assigning EW1 and EW2, the dimensional characteristic quantities that were calculated in processes 2002 and 2003 (in this case, x=EW1−EW2), to the above-described model which represents the relationship between edge widths and focal deviations.

In process 2005, exposure level E is calculated by assigning LW1, the dimensional characteristic quantity that was calculated in process 2002 (in this case, x=LW1), to the above-described model which represents the relationship between pattern widths and exposure levels.

In process 2006, the calculated values of ΔE=E−E0 and ΔF=F−F0 are fed back as the amounts of correction of the exposure conditions. In this way, the optimal conditions are always maintained in this embodiment of the invention.

(5) Configuration Supplied by This Embodiment

The more specific configuration supplied by the above-described embodiment is described below.

A process conditions change monitoring system comprising an image detection means (unit) for obtaining electron beam images of resist patterns (this process corresponds to electron beam acquisition 11), a dimensional characteristic quantity detection means (unit) for acquiring the respective dimensional characteristic quantities of a first pattern portion and a second pattern portion differing from one another in terms of the tendency of the changes in edge widths and/or pattern widths and other dimensional characteristic quantities against changes in exposure conditions (this process corresponds to calculation 12 of the dimensional characteristic quantities (LW1 and LW2) of the first pattern portion and to calculation 13 of the dimensional characteristic quantity (EW2) of the second pattern portion), a means of saving the models for establishing logical linking between exposure conditions and dimensional characteristic quantities, and a means (unit) for calculating changes in exposure conditions by applying, to said models, those dimensional characteristic quantities of said first pattern portion and said second pattern portion that have been acquired by said dimensional characteristic quantity detection means (this process corresponds to calculation 14 of ΔF by the application of models to EW1 and EW2 and to calculation 15 of ΔE by the application of a model to LW1), and further equipped with a means (unit) for providing exposure conditions correction based on the changes in exposure conditions that have been calculated by said calculation means (this process corresponds to ΔE, ΔF data transmission 16).

A semiconductor substrate manufacturing system intended to change the focus value, one of exposure conditions, by use of electron beam images of resist patterns, wherein the semiconductor substrate manufacturing system has an image detection means for obtaining electron beam images of said resist patterns, a means by which the focal deviation tolerances at which the rate of change of the edge width of the particular resist pattern against changes in focus value is maintained at or below a fixed value are calculated from the two pattern portions of said electron beam images, a means (unit) for providing exposure within the focal deviation tolerances that have been calculated by said calculation means (this exposure process corresponds to exposure 17).

A process conditions change monitoring method for monitoring changes in exposure conditions by use of electron beam images of resist patterns during lithography, wherein said monitoring method is characterized in that: images for obtaining electron beam images of said resist patterns are detected, the dimensional characteristic quantities of the resist patterns, including the respective edge widths and pattern widths, are calculated from the electron beam images, and models for establishing logical linking between exposure conditions are provided; changes from the optimal exposure conditions are calculated by first acquiring electron beam images of a first pattern portion and a second pattern portion different from one another in the tendency of the changes in dimensional characteristic quantities against changes in exposure conditions, by said image detection during exposure conditions change monitoring, then calculating the respective dimensional characteristic quantities of the first pattern portion and the second pattern portion by said dimensional characteristic quantity calculation, and calculating actual changes in exposure conditions through applying the corresponding characteristic quantities to the models which establish logical linking between said exposure conditions and said dimensional characteristic quantities, and; the exposure conditions are corrected according to the particular calculation results.

(6) Effects of This Embodiment

According to this embodiment, the three problems described in "Problems to be Solved by the Invention" are solved. First, how to solve the first problem, namely, the inability to detect changes in focus, is described. According to this embodiment, changes in focus can be reliably detected by monitoring edge widths EW1 and EW2. Next, with reference to the second problem (namely, the feedback of changes in focus), according to this embodiment, it is possible to not only detect focal deviations, but also calculate them accurately, by applying edge widths EW1 and EW2 to special models. With reference to the third problem (namely, the inability to quantitatively determine changes in process conditions), according to this embodiment, it is possible to calculate accurate deviations by applying edge widths EW1 and EW2 to the above-mentioned models, to calculate accurate changes in exposure level by applying line width LW1 to a special model, and even to prevent the occurrence of defects in the shape of the film pattern existing after etching.

Also, despite the above-described effects produced from the first embodiment of the present invention, the time required for the execution of the series of operations shown as processes 2002 to 2005 in FIG. 1 is almost the same as the time required for dimensional measurement with CD-SEM during conventional lithography. Therefore, there is the advantage that process throughput does not decrease.

In addition, although, during conventional conditions establishing operations, the determination of the optimal exposure conditions and process window data depends on the subject of the operator, the present invention has the advantage that since the determination is based on models, such data can be determined not only accurately, but also always with equal accuracy.

(7) Second Preferred Mode of Embodiment

Figure 10:
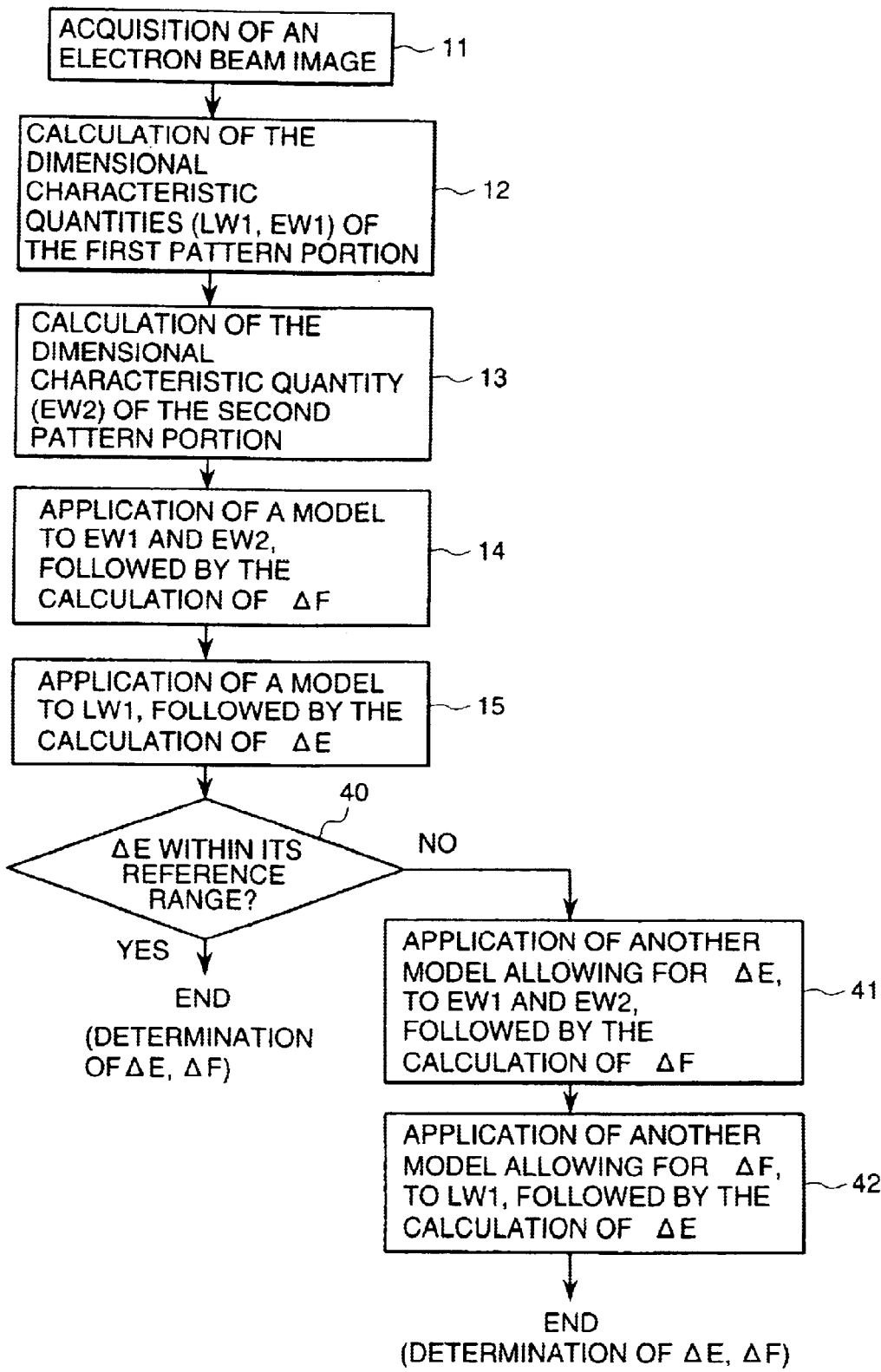
FIG. 10 is a diagram of the process conditions change monitoring system pertaining to the second preferred mode of embodiment.

The second preferred embodiment of the present invention is shown in FIG. 10.

Processes 11 to 15 in FIG. 10 are the same as those of the first embodiment shown in FIG. 1. The same number is assigned to each process in the same mode of embodiment, and the description of FIG. 1 applies by analogy. Processes 40, 41, and 42 are added to the configuration shown in FIG. 1. The first mode of embodiment is based on the assumption that both the exposure level and focus slowly change with time, and is intended to control processes so that the process window data range is not overstepped. However, if any significant changes in process conditions occur abruptly, this may result in feedback data errors (errors in $\Delta E$, $\Delta F$) since the models used to calculate $\Delta E$ and $\Delta F$ can be expressed as the models having mutually independent parameters in process windows as described above. Under this second embodiment, in process 40, the value of $\Delta E$ is checked and if this value is outside its reference (process window), control is moved to the sequence for calculating $\Delta E$ and $\Delta F$ once again. In process 41, $\Delta F$ is recalculated by applying EW1 and EW2 to another model which calculates $\Delta F$ with $\Delta E$ taken into consideration. In process 42, $\Delta E$ is recalculated by applying LW1 to another model which calculates $\Delta E$ with $\Delta F$ taken into consideration.

This embodiment can be implemented either by creating beforehand the model representing the relationship between focus and edge widths (EW1, EW2) for each exposure level, and the model representing the relationship between exposure level and line width (LW1) for each focus value, by, instead of assigning the above-mentioned models as relational expressions and calculating the optimal exposure conditions, providing a lookup table 31 in which EW1, LW1, and EW2 have been defined for each set of exposure conditions as shown in FIG. 11 and searching for the exposure conditions ($\Delta E$, $\Delta F$) that EW1, LW1, and EW2 best match, or by providing both the above-mentioned models and lookup table and referring to the lookup table only if the process window is overstepped.

According to this embodiment, it is possible to realize process control that enables the proper response even in the event of abrupt significant changes in process conditions.

(8) Third Mode of Embodiment

Figure 12A:
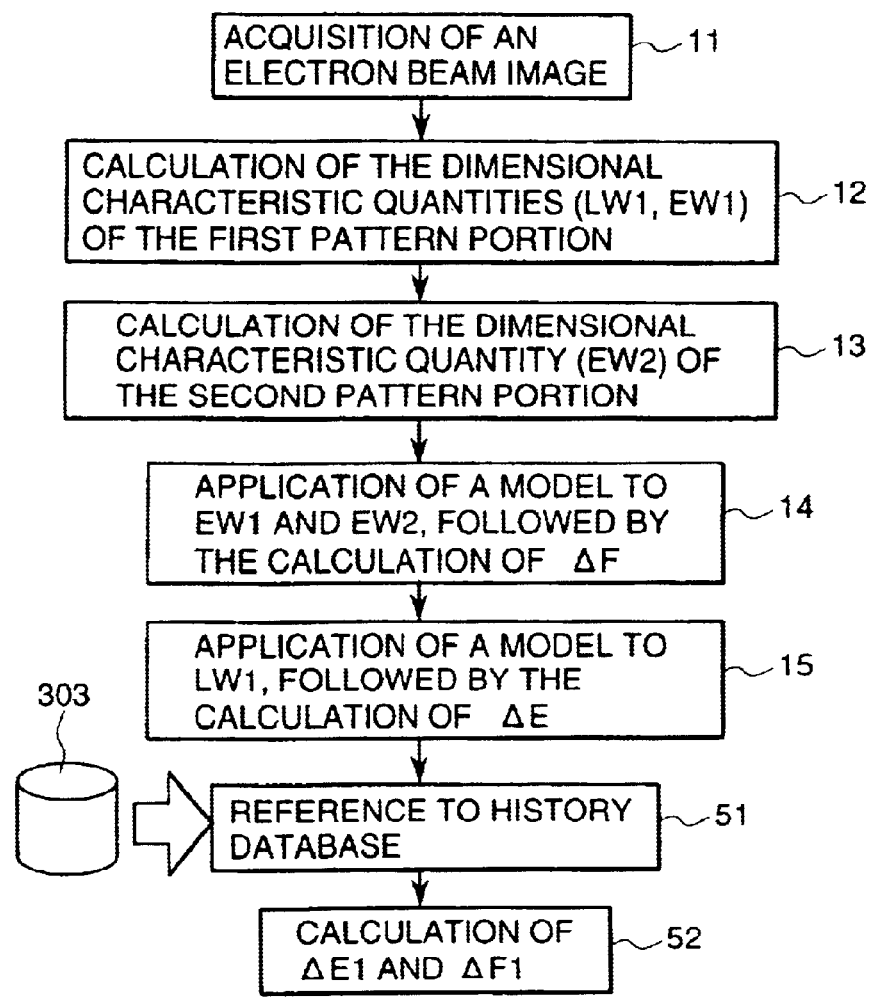
FIGS. 12(a) and 12(b) are diagrams of the process conditions change monitoring system pertaining to the third preferred mode of embodiment.

The third preferred embodiment of the present invention is shown in FIG. 12.

Figure 12B:
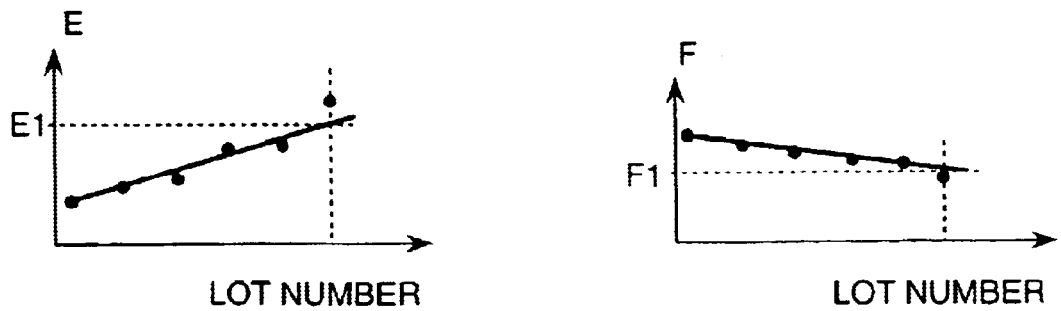

Processes 11 to 15 in FIG. 12 are the same as those of the first embodiment shown in FIG. 1. The same number is assigned to each process in the same mode of embodiment, and the description of FIG. 1 applies by analogy. After $\Delta F$ calculation in process 15, the calculated $\Delta E$ and $\Delta F$ data is not fed back as it is. Instead, old $\Delta E$ and $\Delta F$ data is referred to in process 51 and the final $\Delta E1$ and $\Delta F1$ quantities are determined in process 52. History database 303, for example, contains the $\Delta E$ and $\Delta F$ data relating to several old product lots, and the final $\Delta E1$ and $\Delta F1$ quantities are determined by assigning straight lines to the data within the history database as shown in FIG. 12(b).

Even when the same exposure level and the same focus value are given, resist patterns completely equal in microscopic terms will not be always formed. In addition, if even slight differences in the conditions established to acquire images with CD-SEM occur or if dimensional characteristic quantity calculation errors occur, the $\Delta E$ and $\Delta F$ data calculated from individual inspection targets will include certain errors. Also, since changes in focus are drift-like changes rather than abrupt changes, this embodiment enables stable process control in comparison with the determination of feedback quantities from a single set of results.

Of course, the history database does not always need to be present inside CD-SEM, and it can exist in other memory units present on a particular network. Also, although several old product lots of data is used as history data in the figure, the term "several old product lots of data" merely refers to an example and the second embodiment is not limited to this example.

(9) Other Information

Although it has up to now been described in this document that both the first pattern portion and the second pattern portion are present on one image, when suitable patterns are not adjacently present, even if independent images are acquired, there will be no effects on performance.

Also, special marks for monitoring the exposure conditions can be provided on the wafer. In this case, however, it is desirable that a masked pattern with critical dimensions and a non-masked pattern with critical dimensions should be arranged for the first pattern portion and the second pattern portion, respectively, on one image.

Figure 14:
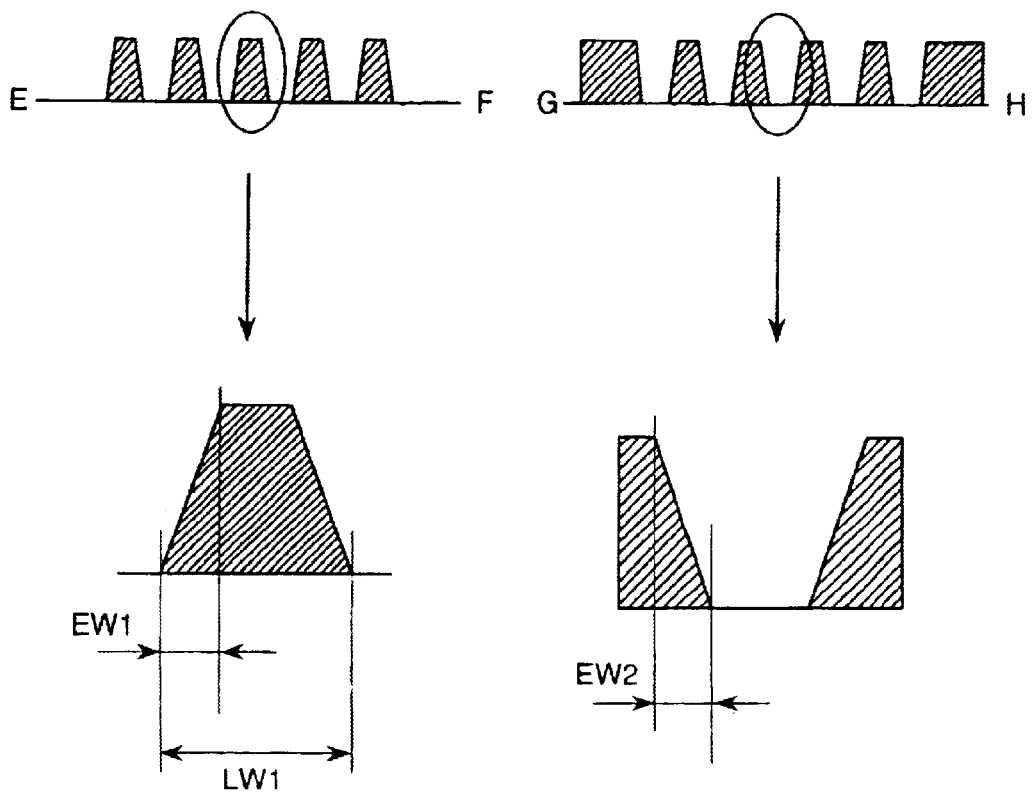
FIG. 14 is a diagram showing the measuring method in the second example of patterns suitable for process conditions change monitoring.

An example of pattern arrangement is shown in FIG. 13. FIG. 13(a) shows an image of a binary mask pattern, wherein white and black denote a transmitting portion and a shielding portion, respectively. Since the left and right patterns in FIG. 13(a) are patterns whose transmitting portion and shielding portions are reversed, both the masked pattern (left) and the non-masked pattern (right) can be formed. The acquisition of an after-development electron beam image enables the obtainment of an image which represents bright edge portions and dark flat portions as shown in FIG. 13(b). In FIG. 13(b), the E-F cross section is taken as the first pattern, and the G-H cross section is taken as the second pattern. The cross-sectional shapes of sections E-F and G-H are shown in FIG. 14. A conceptual diagram of after-development patterns is shown as FIG. 14(b). For example, when attention is drawn to the pattern near the center and the edge width (EW1) of the masked pattern, the edge width (EW2) of the non-masked pattern, and the line width (LW1) of the masked pattern are measured from electron beam images, it will be possible to obtain the same effects as those of the patterns shown in FIGS. 4 and 5. When, similarly to the arrangement of the patterns used in FIG. 14(b), one pattern is surrounded by a multitude of patterns of the same shape, it will also be valid to minimize measurement errors by measuring the edge widths (EW1 and EW2) of the multiple patterns of the same shape and the line width (LW1) of the center pattern and using their average values.

Figure 15A:
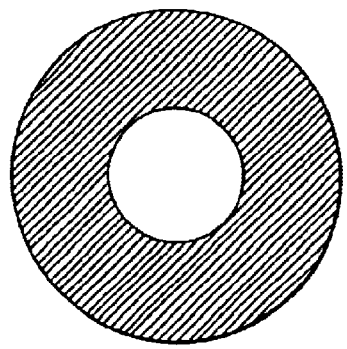
FIGS. 15(a) and 15(b) are diagrams showing a third example of patterns suitable for process conditions change monitoring.
Figure 15B:
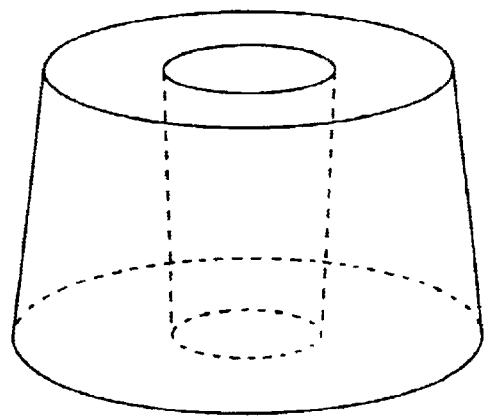
Figure 16A:
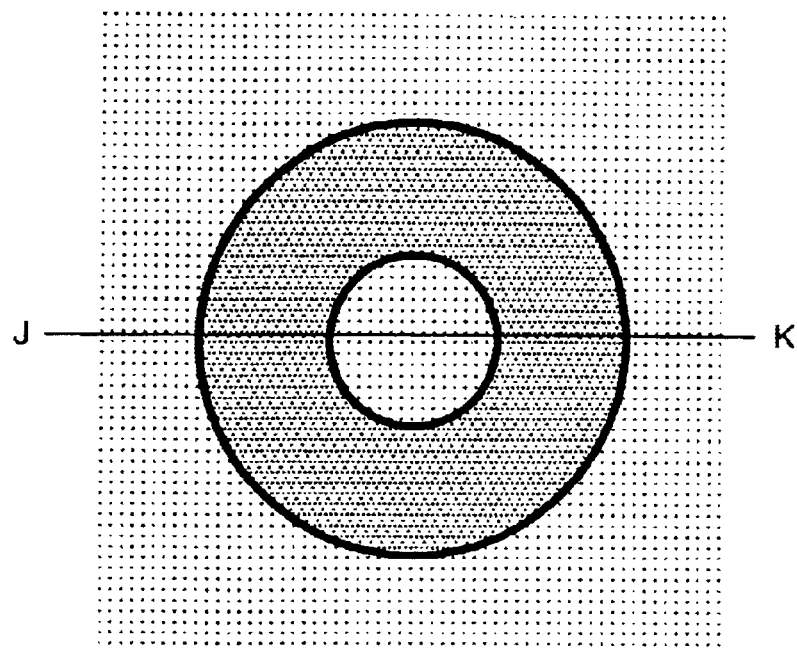
FIGS. 16(a) and 16(b) are diagrams showing the measuring method in the third example of patterns suitable for process conditions change monitoring.
Figure 16B:
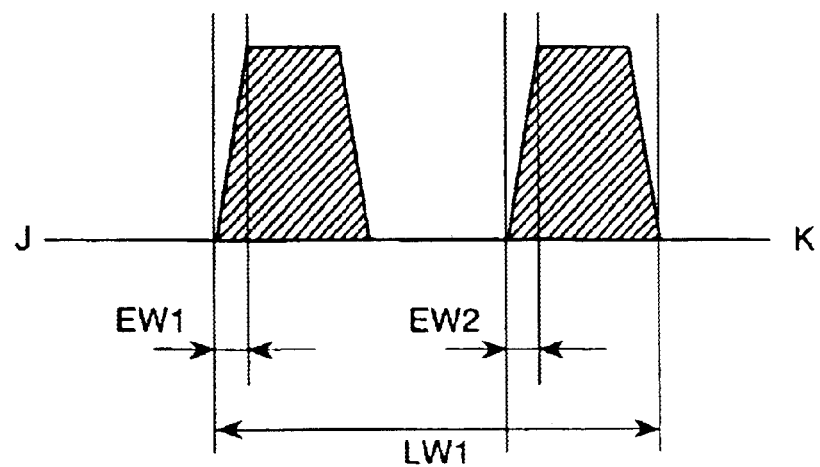
Figure 17:
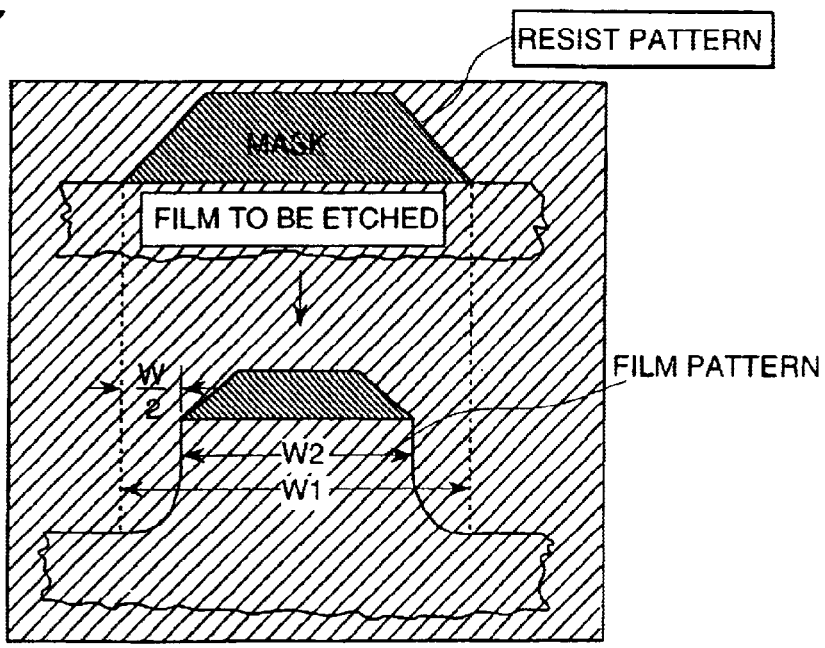
FIG. 17 is an epitomic diagram representing the relationship between the resist pattern and film pattern existing before and after etching.
Figure 18:
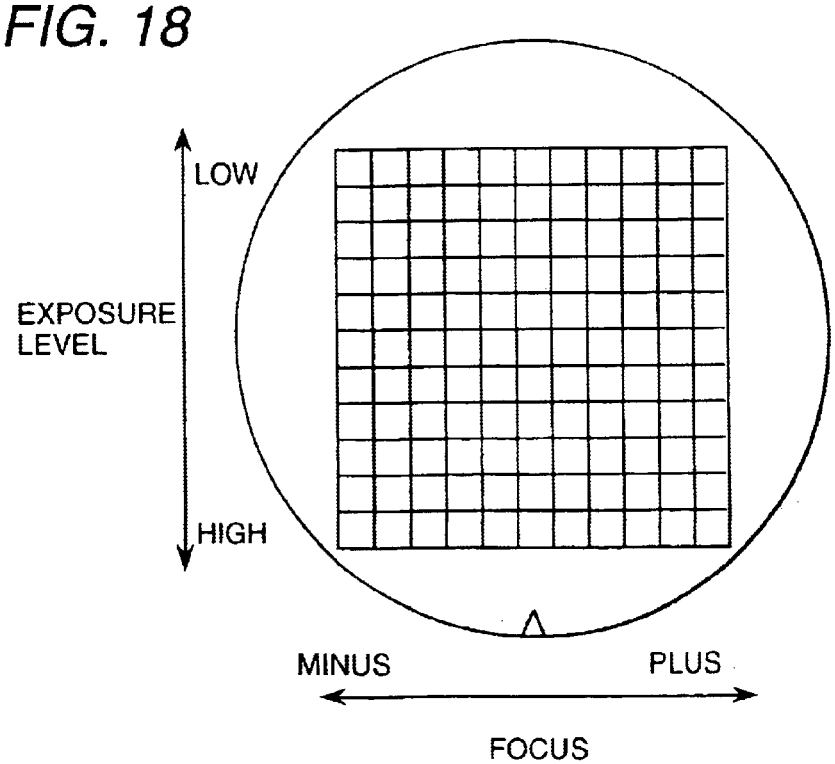
FIG. 18 is a view showing an example of a conditions establishing wafer.

Yet another example is shown in FIG. 15. FIG. 15(a) shows an image of a binary mask pattern, wherein white and black denote a transmitting portion and a shielding portion, respectively. A conceptual diagram of after-development patterns is shown as FIG. 15(b). The center hole pattern corresponds to the non-masked pattern (first pattern portion), and the outer wall portion corresponds to the masked pattern (second pattern portion). FIG. 16(a) shows an electron beam image of this pattern, wherein the image is bright at its edge portions and dark at its flat portion. The cross-sectional shape of this image is shown in FIG. 16(*b*). When the edge width (EW1) of the outer wall and the edge width (EW2) of the inner wall are measured from the electron beam image of FIG. 16(*a*), it will be possible to obtain the same effects as those of the patterns shown in FIGS. 4 and 5.

Important is that the first pattern portion and the second pattern portion should differ in behavior with respect to focus, and their combination does not always need to be such that the behaviors of both patterns are as shown in FIGS. 6(*a*) and (*b*). Also, although the expression for calculating the focus value from EW1-EW2 is used as the focus value calculation model (see numerical expression 1), this expression has been adopted because it is a relational expression suitable for such behavior as shown in FIGS. 6(*a*) and (*b*). If the pattern to be used differs, therefore, another relational expression can, of, course, be used. In addition, three or more patterns, not two patterns, can be used.

Furthermore, although, up to now, the image acquisition positions on the wafer to be inspected have not been described in this document, when this embodiment is to be put into actual operation, it is desirable that ΔE and ΔF should be determined as exposure conditions feedback quantities by acquiring images on a plurality of positions on the wafer and synthetically judging the characteristic quantities obtained from the images.

Furthermore, for more accurate measurement results on edge width, the images acquired by tilting the stage or the beam can also be used.

The following process conditions change monitoring systems and methods are supplied as the systems and methods that use electron beams:

A process conditions change monitoring system and method for monitoring changes in exposure conditions by use of electron beam images of resist patterns during lithography, wherein said monitoring system and method is characterized in that: an image detection means for obtaining electron beam images of said resist patterns, a means for calculating the dimensional characteristic quantities of the resist patterns, including the respective edge widths and pattern widths, from the electron beam images, and models for establishing logical linking between exposure conditions are provided; changes from the optimal exposure conditions are calculated by first acquiring electron beam images of a first pattern portion and a second pattern portion different from one another in the tendency of the changes in dimensional characteristic quantities against changes in exposure conditions, by said image detection means during exposure conditions change monitoring, then calculating the respective dimensional characteristic quantities of the first pattern portion and the second pattern portion by said dimensional characteristic quantity calculation means, and calculating actual changes in exposure conditions through applying the corresponding characteristic quantities to the models which establish logical linking between said exposure conditions and said dimensional characteristic quantities, and; the exposure conditions are corrected according to the particular calculation results.

A process conditions change monitoring system and method for monitoring changes in exposure conditions by use of electron beam images of resist patterns during lithography, wherein said monitoring system and method is characterized in that: an image detection means for obtaining electron beam images of said resist patterns, a means for calculating the dimensional characteristic quantities of the resist patterns, including the respective edge widths and pattern widths, from the electron beam images, and models for establishing logical linking between exposure conditions are provided; changes from the optimal exposure energy level are calculated by first acquiring electron beam images of a first pattern portion and a second pattern portion different from one another in the tendency of the changes in edge width against changes in exposure focus, by said image detection means during exposure conditions change monitoring, then calculating the respective dimensional characteristic quantities of the first pattern portion and the second pattern portion by said dimensional characteristic quantity calculation means, and calculating actual changes in the focus value and energy level existing during exposure through applying the corresponding characteristic quantities to the models which establish logical linking between said exposure conditions and said dimensional characteristic quantities, and; the exposure conditions are corrected according to the particular calculation results.

A process conditions change monitoring system and method characterized in that said first pattern portion is a pattern disposed so as to increase in edge width when the focus value deviates in a plus direction, and in that said second pattern portion is a pattern disposed so as to increase in edge width when the focus value deviates in a minus direction.

A process conditions change monitoring system and method characterized in that a masked pattern with about critical dimensions and a non-masked pattern with about critical dimensions are used as said first pattern portion and second pattern portion, respectively.

A process conditions change monitoring system and method characterized in that different places within one image are used as said first pattern portion and second pattern portion.

A process conditions change monitoring system and method characterized in that said models for establishing logical linking between said exposure conditions and dimensional characteristic quantities are for storing into memory the relationship between changes in the edge width(s) and focus value(s) of said first and/or second pattern or the relationship between changes in the pattern width(s) and energy level(s) of said first and/or second pattern.

A process conditions change monitoring system and method characterized in that said models for establishing logical linking between said exposure conditions and dimensional characteristic quantities are for determining F from EW1 and EW2, wherein the focus value, the edge width calculated from the first pattern portion, and the edge width calculated from the second pattern portion are taken as F, EW1, and EW2, respectively; in other words, for determining actual changes in the focus value when F=f (EW1, EW2).

A process conditions change monitoring system and method characterized in that said models for establishing logical linking between said exposure conditions and dimensional characteristic quantities are tables in which the dimensional characteristic quantities against various exposure conditions are defined for said first pattern portion and second pattern portion each.

A process conditions change monitoring system and method characterized in that when said models for establishing logical linking between said exposure conditions and dimensional characteristic quantities are constructed, electron beam images against various changes in focus value and in exposure energy level are acquired using the exposure test pieces that shift the focus value and exposure energy level of the exposure unit in steps, and calculation results on the respective dimensional characteristic quantities are incorporated into the construction of the models.

A process conditions change monitoring system and method for monitoring changes in exposure conditions by use of electron beam images of resist patterns during lithography, wherein said monitoring system and method is characterized in that an image detection means for obtaining electron beam images of said resist patterns, a means for calculating the dimensional characteristic quantities of the resist patterns, including the respective edge widths and pattern widths, from the electron beam images, and models for establishing logical linking between exposure conditions are provided and in that a function is further provided that automatically determines process window data, namely, focal deviation tolerances and exposure energy level error tolerances, from the relationships between edge width and focal deviations and the relationship between pattern width and exposure energy level.

Figure 21:
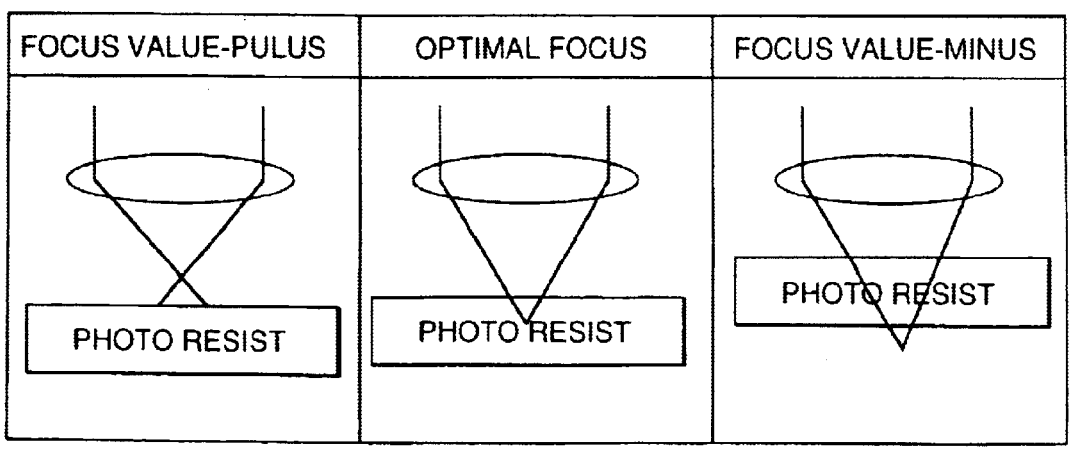
FIG. 21 is a focus value definition diagram.

The meanings of the signs assigned to the focus value of the exposure unit may vary from manufacturer to manufacturer. In the present invention, however, the definitions used in FIG. 21 are used.

According to the present invention, changes in focus can be detected. It is also possible to supply the process conditions change monitoring system and methods that enable not only the detection of changes in exposure level, but also output of information that quantitatively represents changes in process conditions, namely, accurate changes in exposure level and in focus. As a result, it is possible to detect such defects in stereographic shape due to focal deviations as have been overlooked during conventional measurement of dimensions, and thus to avoid defects in the formation of a non-reproducible film pattern after etching. Furthermore, although the determination of the optimal exposure conditions and process window data during conventional conditions establishing operations depends on the subject of the operator, the present invention enables such data to be determined not only accurately, but also always with equal accuracy, since the determination is based on models.

What is claimed is:

1. A process conditions change monitoring system of a scanning-type electronic microscope equipped with a monitoring unit for monitoring changes in exposure conditions by use of electron beam images of a resist pattern, comprising:

an image detection unit for obtaining electron beam images of said resist pattern;

a dimensional characteristic quantity detection means for detecting the respective dimensional characteristic quantities of a first pattern portion and a second pattern portion, which are different from one another in the tendency of the changes in dimensional characteristic quantities, showing the edge widths of the pattern, against changes in exposure conditions;

a memory storing models for establishing logical linking between exposure conditions and dimensional characteristic quantities; and a calculating unit calculating changes in exposure conditions relating to the focus of said scanning-type electronic microscope by applying, to said models, those dimensional characteristic quantities of said first pattern portion and said second pattern portion that have been acquired by said dimensional characteristic quantity detection means.

2. The process conditions change monitoring system of the scanning-type electronic microscope according to claim 1, further comprising a correcting unit for correcting exposure condition according to the changes in exposure conditions that have been calculated by said calculating unit.

3. A process conditions change monitoring system of a scanning-type electronic microscope equipped with a monitoring unit for monitoring changes in exposure conditions relating to focus value, by use of electron beam image of a resist pattern, comprising:

an image detection unit for obtaining electron beam images of said resist pattern;

a dimensional characteristic quantity detection means for detecting the respective dimensional characteristic quantities of the edge widths of a first pattern portion and a second pattern portion, which are different from one another in the tendency of the changes in the dimensional characteristic quantities of the edge widths of the resist pattern, against changes in focus value;

a memory storing models for establishing logical linking between focus value and dimensional characteristic quantities; and a calculating unit for calculating changes in focus value by applying, to said models, those dimensional characteristic quantities of said first pattern portion and said second pattern portion that have been acquired by said dimensional characteristic quantity detection means.

4. The process conditions change monitoring system of the scanning-type electronic microscope according to claim 3, wherein said exposure conditions include exposure levels, in that said models establish logical linking between exposure levels and dimensional characteristic quantities, and wherein said calculation unit also calculates changes in exposure level by applying to the corresponding models the dimensional characteristic quantities, including the pattern widths of said first pattern portion and said second pattern portion that have been acquired by said detection unit.

5. The process conditions change monitoring system of the scanning-type electronic microscope according to claims 3 or 4 above, further comprising correcting the focus value according to the changes in the focus value that have been calculated by said calculating unit.

6. The process conditions change monitoring system of the scanning-type electronic microscope according to claims 3 or 4 above, wherein said calculating unit calculates tolerances on focus value deviations and on exposure energy changes.

* * * * *